United States Patent
Mori et al.

(10) Patent No.: US 8,947,767 B2
(45) Date of Patent: Feb. 3, 2015

(54) EXCITATION LIGHT SOURCE FOR RAMAN AMPLIFICATION, RAMAN AMPLIFIER, AND OPTICAL TRANSMISSION SYSTEM

(71) Applicants: Fujitsu Telecom Networks Limited, Kawasaki-shi, Kanagawa (JP); Fujitsu Limited, Kawasaki-shi, Kanaga (JP)

(72) Inventors: Shota Mori, Kawasaki (JP); Norifumi Shukunami, Kawasaki (JP); Takeshi Hoshida, Kawasaki (JP)

(73) Assignees: Fujitsu Telecom Networks Limited, Kawasaki-shi (JP); Fujitsu Limited, Kawasaki-shi (JP)

(*) Notice: Subject to any disclaimer, the term of this patent is extended or adjusted under 35 U.S.C. 154(b) by 99 days.

(21) Appl. No.: 13/727,506

(22) Filed: Dec. 26, 2012

(65) Prior Publication Data
US 2013/0162987 A1  Jun. 27, 2013

(30) Foreign Application Priority Data
Dec. 26, 2011 (JP) ................................. 2011-283530

(51) Int. Cl.
*H01S 3/30* (2006.01)

(52) U.S. Cl.
USPC ......................... 359/334; 359/341.3

(58) Field of Classification Search
USPC .................................. 359/334, 341.3
See application file for complete search history.

(56) References Cited

U.S. PATENT DOCUMENTS 6,603,593 B2 *  8/2003  Fidric et al. .................... 359/334
7,085,440 B2 *  8/2006  Kimura et al. .................. 385/11

FOREIGN PATENT DOCUMENTS

JP  2010-129805  6/2010

* cited by examiner

*Primary Examiner* — Mark Hellner
(74) *Attorney, Agent, or Firm* — Christie, Parker & Hale, LLP

(57) ABSTRACT

An excitation light source, for Raman amplification, includes a polarization beam splitter (PBS) for splitting a laser beam from an excitation laser into two polarization components, and a polarization beam combiner (PBC) for combining the two polarization components, and a time difference generator provided between PBS and PBC. The time difference generator generates a difference in propagation time between the two polarization components.

9 Claims, 13 Drawing Sheets

EXCITATION LIGHT SOURCE FOR RAMAN AMPLIFICATION, RAMAN AMPLIFIER, AND OPTICAL TRANSMISSION SYSTEM

CROSS-REFERENCE TO RELATED APPLICATION

This application claims priority to and the benefit of Japanese Patent Application Number 2011-283530, filed on Dec. 26, 2011, the entire disclosure of which is incorporated herein by reference.

BACKGROUND OF THE INVENTION

1. Field of the Invention

The present invention relates to an excitation light source to be used for Raman amplification and a Raman amplifier and an optical transmission system using the excitation light source.

2. Description of the Related Art

In recent years, a positive progress has been made in the development of ultrahigh-speed WDM (wavelength division multiplexing) optical transmission systems of 100 Gbps and above using a digital coherent receiving method. The digital coherent receiving method provides the following distinctive advantages:

Receiving sensitivity can be improved by the detection of signal light through mixing with local light.

The wavelength dispersion and polarization mode dispersion can be compensated for by use of a digital circuit.

With these advantages, the systems using the digital coherent receiving method can realize long-distance transmission of ultrafast signals which have previously been impracticable. Moreover, such systems no longer require wavelength dispersion compensation using dispersion compensation fibers and thus allow transmission even through optical transmission path of inferior quality with much polarization mode dispersion (PMD).

In a polarization mode dispersion, differential group delay (DGD) occurs between two polarization modes orthogonal to each other of light transmitting through an optical fiber. The DGD is caused by random birefringence that occurs due to slight distortions of the core of optical fiber or stresses from the outside (e.g., environmental temperature change or mechanical vibration). The DGD, which indicates the amount of separation of two signal components having separated within the optical fiber, can vary greatly with wavelength or time. The polarization mode dispersion is an average value of DGD with respect to wavelength and time.

In a WDM optical transmission system, a high optical signal-to-noise ratio (OSNR) must be achieved if a high-speed optical transmission at 100 Gbps is to be accomplished with a quality equivalent to that of the optical transmission at 10 Gbps or 40 Gbps. In the WDM optical transmission system, an erbium-doped fiber amplifier (EDFA) may be used to amplify optical signals that have been attenuated. Yet, if the transmission distance is long, the input level of the EDFA can drop, which causes a drop in the optical signal-to-noise ratio. So when the transmission distance is long, a backward excitation Raman amplifier is introduced. A Raman amplifier is a distributed amplifier that acts on optical fiber transmission path itself as the amplification medium. When a Raman amplifier is used, the lowest power of signal light in the optical transmission path can be maintained higher than when the Raman amplifier is not used. This will limit the drop in the optical signal-to-noise ratio (see Reference (1) in the following Related Art List, for instance).

RELATED ART LIST (1) Japanese Unexamined Patent Application Publication No. 2010-129805.

Use of the digital coherent receiving method has realized error-free receiving by the optical receivers even when the ultrahigh-speed optical signals of 100 Gbps or higher have come through an optical transmission path having considerable polarization mode dispersion. However, the Raman amplifier, when it is applied to an optical transmission path having considerable polarization mode dispersion, is likely to pose a problem of polarization-dependent gain (PDG).

FIG. 1 shows an example of a conventional Raman amplifier. A Raman amplifier 1 includes an optical transmission path (single mode fiber) 2 through which signal light is transmitted, an excitation light source for Raman amplification 3, and a WDM coupler 4 for supplying excitation light outputted from the excitation light source for Raman amplification 3 to the signal light.

The Raman amplifier makes use of a physical phenomenon called stimulated Raman scattering (SRS). In this phenomenon, signal light is amplified as the optical power of excitation light transfers to the optical power of signal light. The gain of the Raman amplifier is known to be dependent on the relationship between the polarization state of excitation light and the polarization state of signal light. The laser beam outputted from an excitation laser is a linearly polarized light. Therefore, insertion of the laser beam from an excitation laser directly into the optical transmission path causes high gain of main signal components whose plane of polarization coincides with the linearly polarized light of the excitation light and low gain of the other main signal components. This can be a primary factor for causing characteristic degradation when the signals are reproduced at a receiver and therefore must be avoided.

Accordingly, in a conventional Raman amplifier 1 as shown in FIG. 1, a polarization maintaining fiber (PMF) is used as a pigtail fiber 6 of an excitation laser 5, and a polarization maintaining fiber 7 of about 10 meters, for instance, is splice-connected to the pigtail fiber 6 at an inclination of 45 degrees between the main axes. This method of splicing will hereinafter be referred to as "45-degree splicing". As a result, the linearly-polarized laser beam outputted from the excitation laser 5 is split into a fast axis component F and a slow axis component S, and these components are outputted with a differential group delay rd having resulted during passage through the polarization maintaining fiber 7. For example, when the polarization maintaining fiber 7 is 10 meters long, the differential group delay that can be caused is about 10 ps. The polarization maintaining fiber 7 is called a depolarizer because of its depolarizing effect. The excitation light outputted from the excitation light source for the Raman amplification is supplied to the optical transmission path 2 via the WDM coupler 4.

It is known that the occurrence of polarization-dependent gain at a Raman amplifier can be suppressed by use of a sufficiently low value for the degree of polarization (DOP) of the excitation light. The degree of polarization has much to do with the spectrum of laser beam outputted from the excitation laser 5. FIG. 2 shows a spectral waveform of laser beam outputted from the excitation laser 5. FIG. 3 shows a relationship between DOP and DGD when the laser beam has a spectral waveform shown in FIG. 2.

As shown in FIG. 3, when DGD=0 ps, that is, when the polarization maintaining fiber is not used, the DOP is 100%. With the DGD increased by use of longer polarization maintaining fibers 7, the value of DOP drops gradually, and the DOP drops to several percent (first local minimum value) when DGD is about 15 ps in the example shown FIG. 3. With the DGD further increased, the DOP increases and reaches the level of about 50% when DGD is about 30 ps. With the DGD further increased, the DOP drops closer to 0%; by repeating damped oscillation.

There is a Fourier transform relationship between the spectrum of laser beam shown in FIG. 2 and the waveform of DGD vs. DOP shown in FIG. 3. Therefore, if the spectrum of laser beam changes under the influence of individual variation of the excitation laser 5, temperature, drive current condition, and the like, then the waveform of DGD vs. DOP will also change accordingly. In a conventional technology, the length of the polarization maintaining fiber 7 is so determined that the DOP takes the first local minimum value, for instance, to set a low value for the DOP.

So long as the DGD in the optical transmission path 2 is as small as several ps, the arrangement as described above will suffice to control the polarization dependency of the gain at the Raman amplifier. However, when the DGD fluctuates considerably due to inferior quality of the optical transmission path 2, the DGD of about 10 ps created by the polarization maintaining fiber 7 is canceled out by the DGD of the optical transmission path 2, and thus the DOP of the excitation light momentarily created in the optical transmission path 2 can rise high (e.g., DOP=100%). In such a case, the gain of the Raman amplifier may show a significant polarization dependency.

The DGD in the optical transmission path 2 varies with individual variation, laying condition, temperature, time, and the like. When an optical transmission path 2 of inferior quality is used, there is a possibility that the DGD in the optical transmission path 2 reaches 100 ps, for instance, as an instantaneous value. According to the waveform of DGD vs. DOP shown in FIG. 3, the range of DGD where the DOP is 10% or below in the neighborhood of the first local minimum point is as narrow as about 10 ps. Therefore, if the variation of DGD in the optical transmission path 2 is taken into consideration, it is difficult to reliably suppress the DOP into 10% or below even if the length of the polarization maintaining fiber 7 is so set as to have the first local minimum value of DOP.

It is known that the waveform of DGD vs. DOP shows a damped oscillation when the DGD is increased. For instance, in the example of FIG. 3, if the DGD created by the polarization maintaining fiber 7 is 100 ps or over, the DOP of 10% or below can be guaranteed. If there is a possibility that the DGD in the optical transmission path 2 reaches 100 ps as an instantaneous value, then it is desirable that the DGD to be created by the polarization maintaining fiber 7 be set at 200 ps or higher. Moreover, when there are many relayed transmission sections, there may be cases where a DGD of about 1 ns is required.

If a DGD of 1 ns is to be realized by a fiber-type depolarizer as shown in FIG. 1, a polarization maintaining fiber 7 of about 1 km in length must be prepared. Yet, a large space will be required to house 1 km of polarization maintaining fiber, and the excitation light source for Raman amplification will necessarily be large. Also, since the polarization maintaining fiber is more expensive than the ordinary single mode fiber, the excitation light source for Raman amplification may be extremely expensive if the polarization maintaining fiber 7 of 1 km in length is used.

SUMMARY OF THE INVENTION

The present invention has been made in view of the foregoing circumstances, and a purpose thereof is to provide an excitation light source for Raman amplification capable of appropriately suppress the occurrence of polarization-dependent gain and a Raman amplifier and an optical transmission system using such excitation light source.

In order to resolve the above-described problems, an excitation light source, for Raman amplification, includes: a laser beam output unit configured to output laser beam; a polarization beam splitter configured to split the laser beam into two polarization components; a polarization beam combiner configured to combine the two polarization components; and a time difference generator, provided between the polarization beam splitter and the polarization beam combiner, configured to generate a difference in propagation time between the two polarization components.

The laser beam output unit and the polarization beam splitter may be connected by a polarization maintaining fiber.

An optical path between the polarization beam splitter and the polarization beam combiner may be formed of two polarization maintaining fibers through which the two polarization components propagate, respectively.

An excitation light source for Raman amplification according to claim 3, wherein the time difference generator may generate the difference in propagation time between the two polarization components by making the lengths of the two polarization maintaining fibers to differ from each other.

The time difference generator may be configured such that the difference in length between the two polarization maintaining fibers may be varied.

The polarization beam splitter and/or the polarization beam combiner may be formed by melting and stretching optical fiber.

An optical path between the polarization beam splitter and the polarization beam combiner may be formed by a spatial optical system.

The time difference generator may generate the difference in propagation time between the two polarization components by making the optical lengths of the two polarization components to differ from each other.

The time difference generator may include an optical glass or an optical crystal provided in the optical path of at least one of the two polarization components.

The time difference generator may further include a refractive-index control unit for varying the refractive index of the optical glass or the optical crystal. The refractive-index control unit may include a temperature control unit for varying the temperature of the optical glass or the optical crystal.

The time difference generator may include a varying mechanism for mechanically varying the optical path of at least one of the two polarization components.

The polarization beam splitter and/or the polarization beam combiner may include a polarization split membrane that splits the laser beam from the laser beam output unit into the two polarization components.

The laser beam output unit may include: a first laser for outputting a first laser beam of a first wavelength; a second laser for outputting a second laser beam of a second wavelength; and a polarization maintaining wavelength-division-multiplexing (WDM) coupler for wavelength-multiplexing the first laser and the second laser with polarization states thereof being kept.

The laser beam output unit may include: a first laser for outputting a first laser beam; a second laser for outputting a second laser beam; and a polarization beam combiner for combining the first laser beam and the second laser beam such that polarization planes of the first laser beam and the second laser beam are orthogonal to each other.

The laser beam output unit may include: a first laser for outputting a first laser beam of a first wavelength; a second laser for outputting a second laser beam of a second wavelength; a third laser for outputting a third laser beam of a third wavelength; a fourth laser for outputting a fourth laser beam of a fourth wavelength; a first polarization maintaining WDM coupler for wavelength-multiplexing the first laser and the second laser with polarization states thereof being kept; a second polarization maintaining WDM coupler for wavelength-multiplexing the third laser and the fourth laser with polarization states thereof being kept; and a polarization beam combiner for combining a first wavelength-multiplexed laser beam outputted from the first polarization maintaining WDM coupler and a second wavelength-multiplexed laser beam outputted from the second polarization maintaining WDM coupler such that polarization planes of the first wavelength-multiplexed laser beam and the second wavelength-multiplexed laser beam are orthogonal to each other.

Another embodiment of the present invention relates also to an excitation light source for Raman amplification. The excitation light source for Raman amplification includes: a first laser for outputting a first laser beam of a first wavelength; a first polarization beam splitter configured to split the first laser beam into two polarization components; a first polarization beam combiner configured to combine the two polarization components split by the first polarization beam splitter; a first time difference generator, provided between the first polarization beam splitter and the first polarization beam combiner, configured to generate a difference in propagation time between the two polarization components; a second laser for outputting a second laser beam of a second wavelength; a second polarization beam splitter configured to split the second laser beam into two polarization components; a second polarization beam combiner configured to combine the two polarization components split by the second polarization beam splitter; a second time difference generator, provided between the second polarization beam splitter and the second polarization beam combiner, configured to generate a difference in propagation time between the two polarization components; and a WDM coupler configured to wavelength-multiplex the first laser beam outputted from the first polarization beam combiner and the second laser beam outputted from the second polarization beam combiner.

Still another embodiment of the present invention relates to a Raman amplifier. The Raman amplifier Raman-amplifies signal light by use of any one of the above-described excitation light source for Raman amplification.

Still another embodiment of the present invention relates to an optical transmission system. The optical transmission system includes the above-described Raman amplifier.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1:
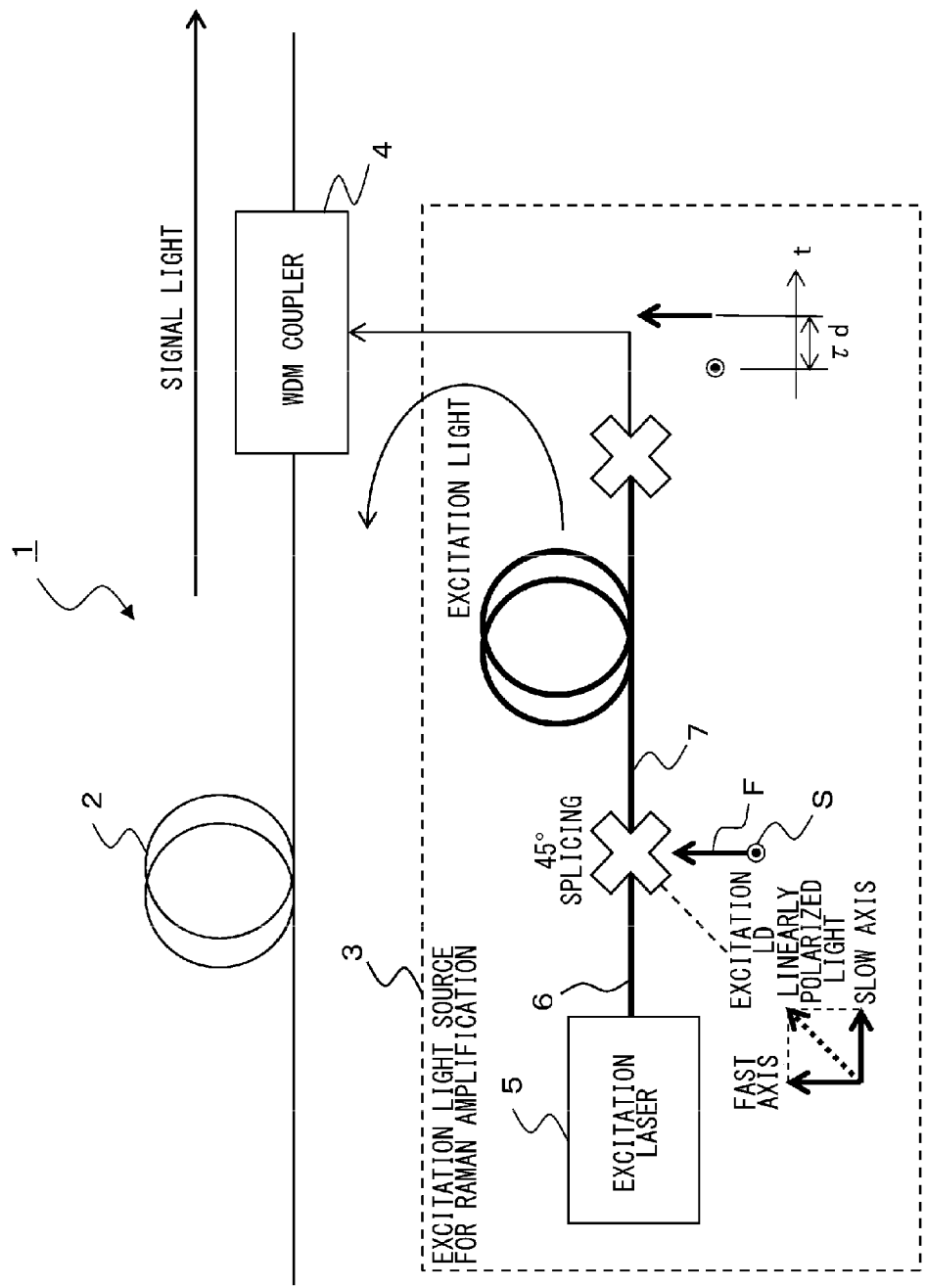
FIG. 1 shows an example of a conventional Raman amplifier.

The invention will now be described by reference to the preferred embodiments. This does not intend to limit the scope of the present invention, but to exemplify the invention.

The invention will now be described based on preferred embodiments which do not intend to limit the scope of the present invention but exemplify the invention. Note that the identical components are given the identical reference numerals in all accompanying figures.

Figure 4:
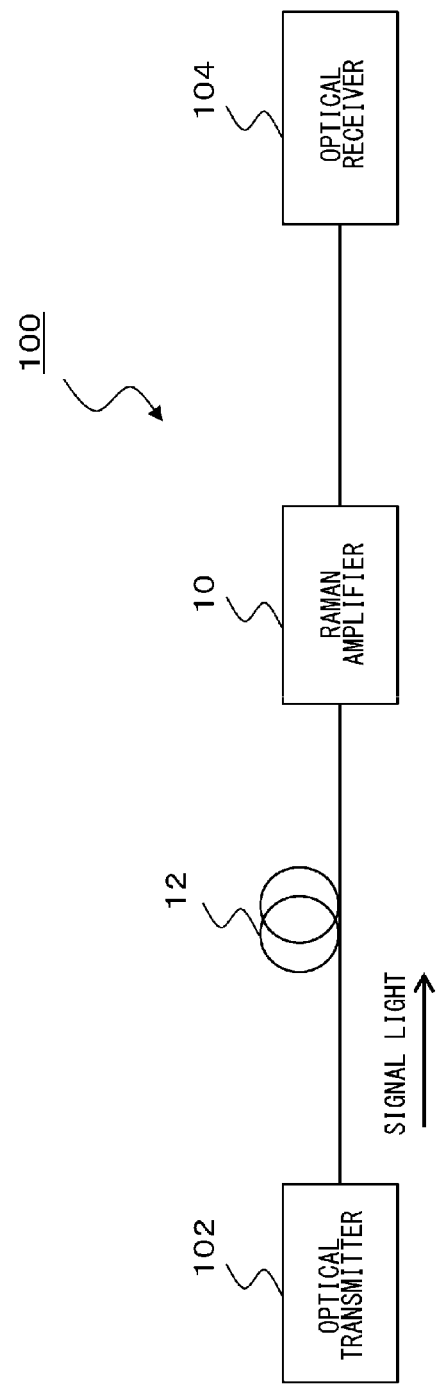
FIG. 4 shows an optical transmission system using a Raman amplifier according to an embodiment of the present invention.

FIG. 4 shows an optical transmission system using a Raman amplifier according to an embodiment of the invention. An optical transmission system 100 shown in FIG. 4 includes an optical transmitter 102, an optical receiver 104, an optical transmission path 12 connecting the optical transmitter 102 and the optical receiver 104, and a Raman amplifier 10 installed at a point (e.g., at a midway point) along the optical transmission path 12. Preferably, a single mode fiber is used for the optical transmission path 12.

In the optical transmission system 100, signal light outputted from the optical transmitter 102 is inputted to the Raman amplifier 10 via the optical transmission path 12. The signal light amplified by the Raman amplifier 10 is received by the optical receiver 104. The signal light to be outputted from the optical transmitter 102 may be signal light of single wavelength or WDM signal light, which is multiplexed signal light of multiple wavelengths.

Figure 5:
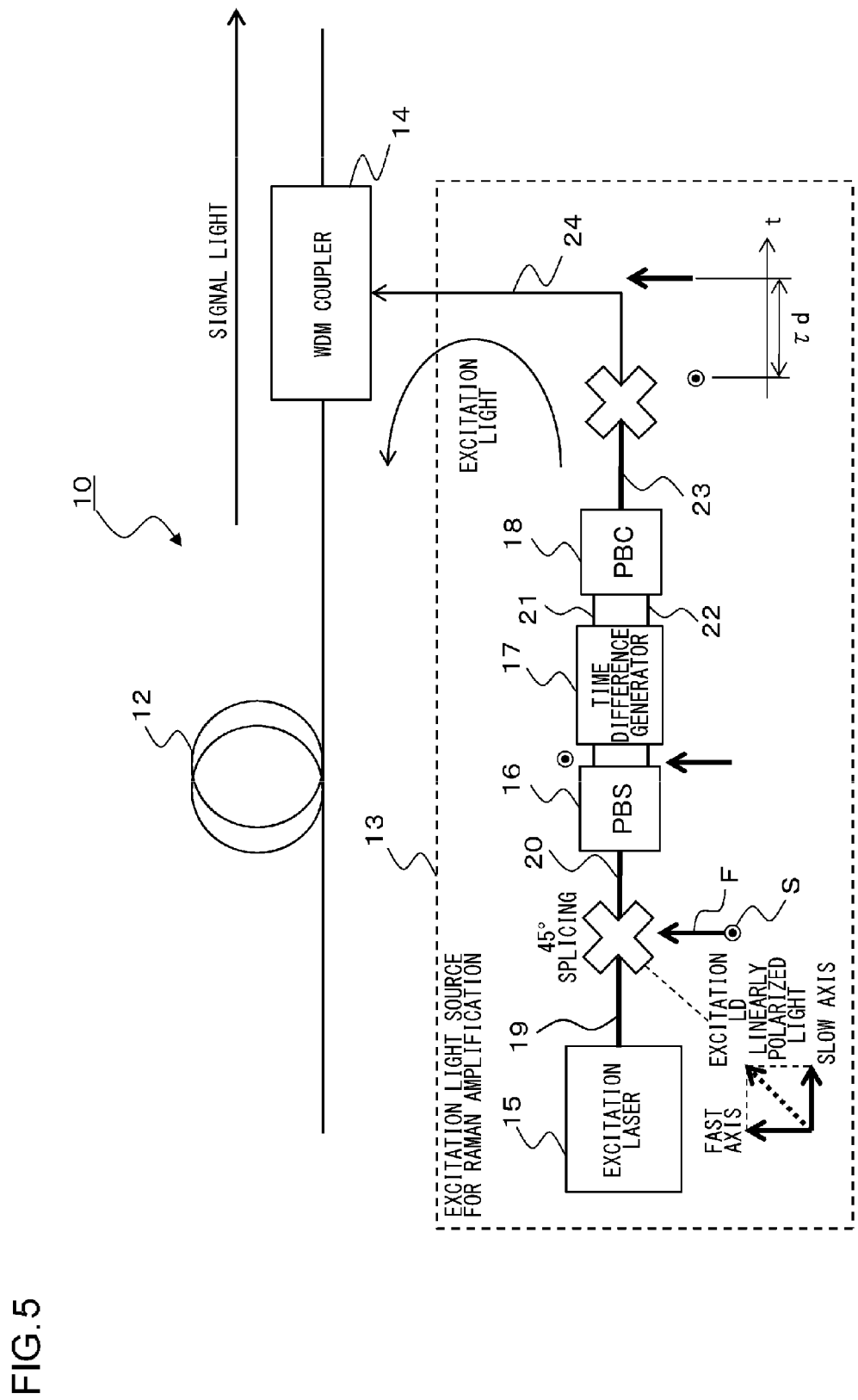
FIG. 5 shows a Raman amplifier according to an embodiment of the present invention.

FIG. 5 shows a Raman amplifier 10 according to an embodiment of the invention. As shown in FIG. 5, the Raman amplifier 10 includes an optical transmission path 12 through which signal light is transmitted, an excitation light source for Raman amplification 13, and a WDM coupler 14 for supplying excitation light outputted from the excitation light source for Raman amplification 13 to the signal light.

As shown in FIG. 5, the excitation light source for Raman amplification 13 includes an excitation (pumping) laser 15, a polarization beam splitter (PBS) 16, a time difference generator 17, and a polarization beam combiner (PBC) 18.

Figure 2:
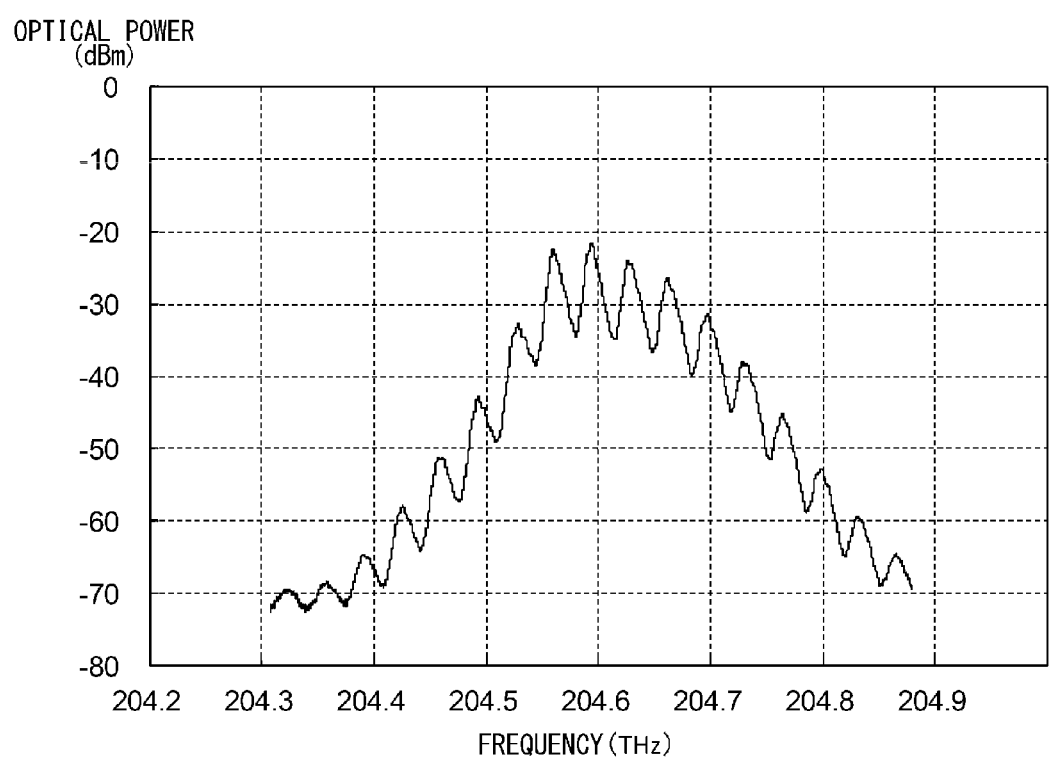
FIG. 2 shows a spectral waveform of laser beam outputted from excitation laser.

The excitation laser 15 is a semiconductor laser that performs multi-mode oscillation. The laser beam outputted from the excitation laser 15 may have a spectrum as shown in FIG. 2, for instance. The laser beam outputted from the excitation laser 15 is a linearly polarized light.

Connected to the output end of the excitation laser 15 is a pigtail fiber 19. The pigtail fiber 19 is a polarization maintaining fiber. The pigtail fiber 19 is connected in a 45-degree splicing to a polarization maintaining fiber 20 attached to the input end of the polarization beam splitter 16.

The polarization beam splitter 16 splits an inputted laser beam into two polarization components, namely, a fast axis component F and a slow axis component S. The polarization beam splitter 16 that can be used may be a fiber-type polarization beam splitter that is formed by melting and stretching optical fiber and a bulk-type polarization beam splitter that has a polarization split membrane formed into a prism.

The two polarization components separated by the polarization beam splitter 16 are inputted to the polarization beam combiner 18 after passing through their respective optical paths. That is, the slow axis component S is inputted to the polarization beam combiner 18 after passing through a first optical path 21, whereas the fast axis component F is inputted to the polarization beam combiner 18 after passing through a second optical path 22.

Provided in the optical paths between the polarization beam splitter 16 and the polarization beam combiner 18 is a time difference generator 17. The time difference generator 17 has a function of generating a difference in propagation time between the two polarization components of slow axis component S and fast axis component F. For example, the time difference generator 17 may generate a difference in propagation time between the two polarization components by making the propagation time of the slow axis component S slower than that of the fast axis component F. Alternatively, the time difference generator 17 may generate a difference in propagation time between the two polarization components by making the propagation time of the fast axis component F slower than that of the slow axis component S.

The polarization beam combiner 18 combines the inputted slow axis component S and fast axis component F and then outputs the polarization-combined laser beam to a polarization maintaining fiber 23. FIG. 5 shows a process in which the slow axis component S and the fast axis component F, having a differential group delay rd, are outputted to the polarization maintaining fiber 23. Note that FIG. 5 shows an example where the time difference generator 17 makes the propagation time of the slow axis component S slower than that of the fast axis component F.

Splice-connected to the polarization maintaining fiber 23 is a single mode fiber 24. The laser beam outputted from the polarization beam combiner 18 is inputted to the WDM coupler 14 via the polarization maintaining fiber 23 and the single mode fiber 24.

The WDM coupler 14 introduces the laser beam inputted from the excitation light source for Raman amplification 13 as excitation light into the optical transmission path 12, thereby causing a stimulated Raman amplification.

According to the excitation light source for Raman amplification 13 configured as described above, the laser beam is physically separated into two polarization components by the polarization beam splitter 16, and a difference in propagation time can be set between the two polarization components. Therefore the laser beam which is obtained by polarization-combining the two polarization components has a differential group delay Td proportional to the difference in propagation time. A large difference in propagation time set between the two polarization components can create a large DGD in the excitation light, which allows the setting of a low value for the degree of polarization (DOP) of the excitation light. As a result, the occurrence of polarization-dependent gain at the Raman amplifier 10 can be suppressed.

Hereinafter, the preferred exemplary embodiments of the present invention will be explained more concretely.

Figure 6:
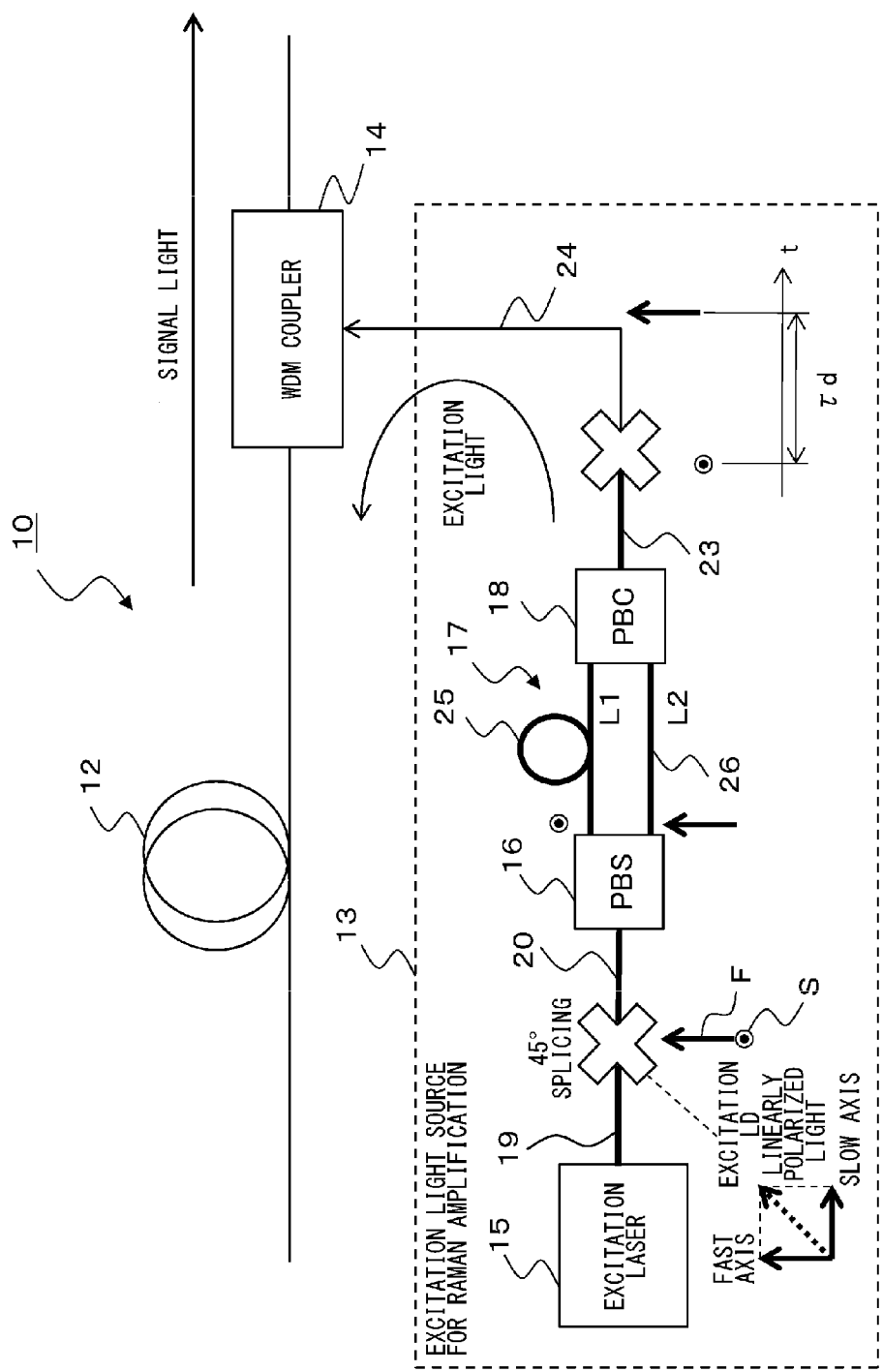
FIG. 6 shows a Raman amplifier according to a first exemplary embodiment of the present invention.

FIG. 6 shows a Raman amplifier 10 according to a first exemplary embodiment of the invention. In the excitation light source for Raman amplification 13 of the Raman amplifier 10 shown in FIG. 6, the polarization beam splitter 16 is coupled to the polarization beam combiner 18 via two polarization maintaining fibers, namely, a first polarization maintaining fiber 25 and a second polarization maintaining fiber 26. The first polarization maintaining fiber 25 constitutes a first optical path through which the slow axis component S propagates, and the second polarization maintaining fiber 26 constitutes a second optical path through which the fast axis component F propagates. In the first embodiment, the polarization beam splitter 16 and/or the polarization beam combiner 18 to be used are preferably optical devices formed by melting and stretching optical fiber.

Figure 3:
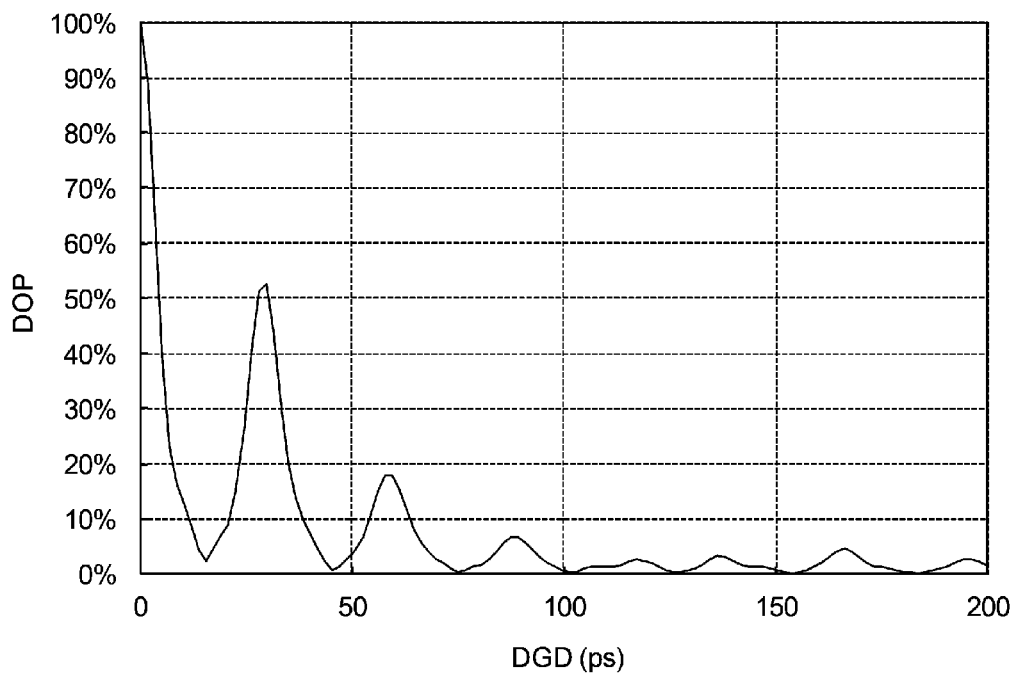
FIG. 3 shows a relationship between DOP and DGD when laser beam has a spectral waveform shown in FIG. 2.

In the first embodiment, the first polarization maintaining fiber 25 and the second polarization maintaining fiber 26 constitute a time difference generator 17. In the first embodiment, the difference in propagation time between the slow axis component S and the fast axis component F is created by the difference set between the length L1 of the first polarization maintaining fiber 25 and the length L2 of the second polarization maintaining fiber 26. For example, the length L1 of the first polarization maintaining fiber 25 through which the slow axis component S passes is set at 3 meters, and the length L2 of the second polarization maintaining fiber 26 through which the fast axis component F passes is set at 1 meter. Since the speed of light passing through an optical fiber is about 5 ns/m, the 2-meter difference in fiber length can cause a differential group delay of 10 ns between the slow axis component S and the fast axis component F. As is evident from FIG. 3, the differential group delay of 10 ns is sufficient to hold the degree of polarization of the excitation light at 10% or below.

If a differential group delay of 10 ns is to be realized by a fiber-type depolarizer as shown in FIG. 1, it will be necessary to prepare a polarization maintaining fiber 7 of about 10 km in length. However, according to the first embodiment, the difference in fiber length of only 2 meters is required, and hence there is no need for so large a space to house the polarization maintaining fibers. Thus, the first embodiment of the invention can downsize the excitation light source for Raman amplification 13. Also, without the need for any extremely long fiber, the excitation light source for Raman amplification 13 can be fabricated at a low cost.

Figure 7:
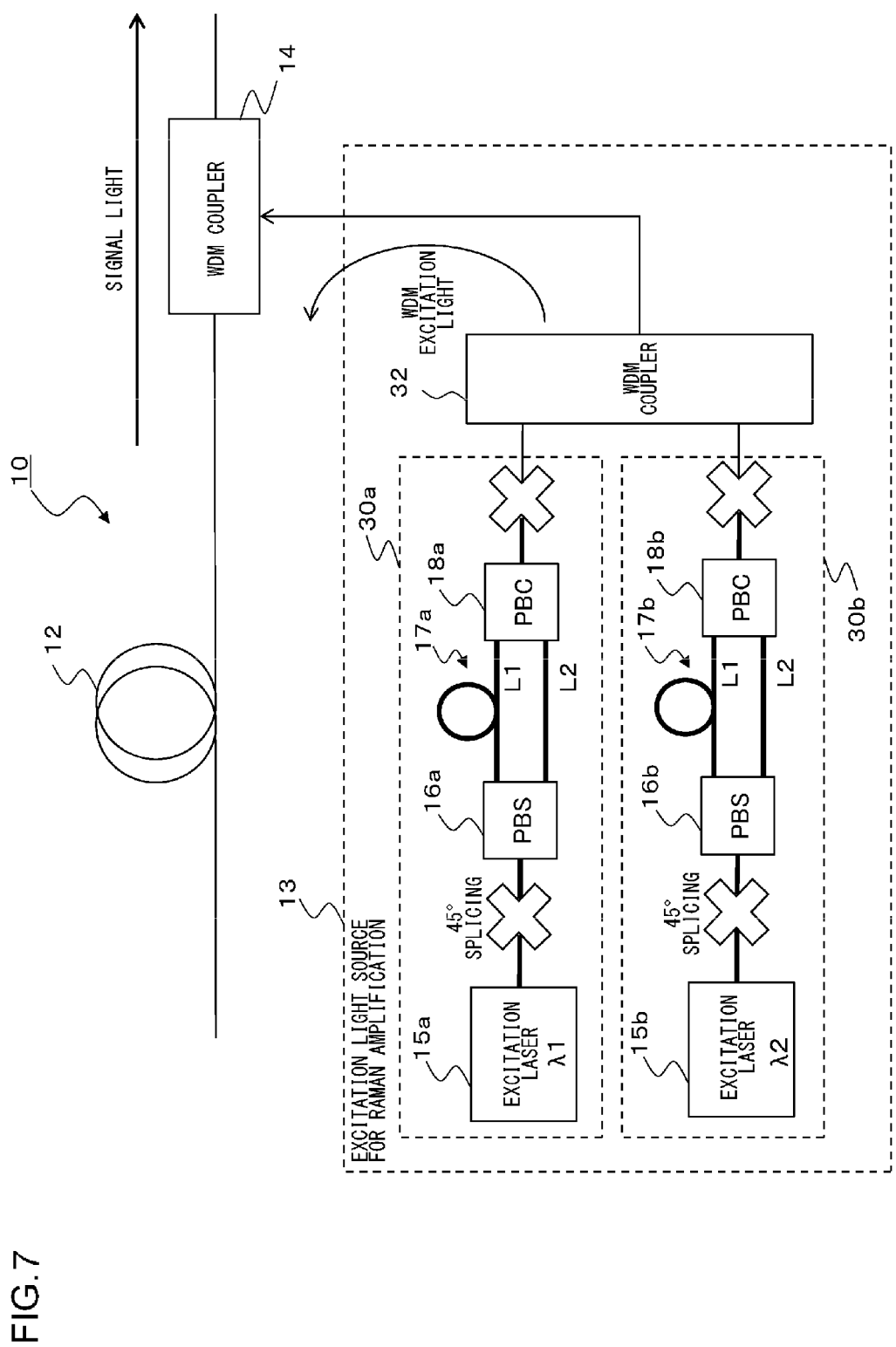
FIG. 7 shows a Raman amplifier according to a second exemplary embodiment of the present invention.

FIG. 7 shows a Raman amplifier 10 according to a second exemplary embodiment of the invention. As shown in FIG. 7, an excitation light source for Raman amplification 13 of the Raman amplifier 10 according to the second embodiment includes a first light source unit 30a, a second light source unit 30b, and a WDM coupler 32 that wavelength-multiplexes the laser beam outputted from the first light source unit 30a and the second light source unit 30b. The first light source unit 30a and the second light source unit 30b have each a constitution identical to that of the excitation light source for Raman amplification shown in FIG. 6.

The first light source unit 30a includes a first excitation laser 15a for outputting a first laser beam of a first wavelength λ1, a first polarization beam splitter 16a for separating the first laser beam into two polarization components, a first polarization beam combiner 18a for combining the two polarization components separated by the first polarization beam splitter 16a, and a first time difference generator 17a provided in the optical path between the first polarization beam splitter 16a and the first polarization beam combiner 18a to generate a difference in propagation time between the two polarization components. Similarly to the first embodiment shown in FIG.

6, the first time difference generator 17a is comprised of two polarization maintaining fibers of different lengths.

The second light source unit 30b includes a second excitation laser 15b for outputting a second laser beam of a second wavelength λ2, a second polarization beam splitter 16b for separating the second laser beam into two polarization components, a second polarization beam combiner 18b for combining the two polarization components separated by the second polarization beam splitter 16b, and a second time difference generator 17b provided in the optical path between the second polarization beam splitter 16b and the second polarization beam combiner 18b to generate a difference in propagation time between the two polarization components. The second time difference generator 17b is also comprised of two polarization maintaining fibers of different lengths.

In the second embodiment, the first wavelength λ1 and the second wavelength λ2 are different wavelengths from each other. In the second embodiment, the first laser beam of the first wavelength λ1 and the second laser beam of the second wavelength λ2 are wavelength-multiplexed by the WDM coupler 32 and outputted as WDM excitation light to the optical transmission path 12. In this manner, wideband WDM signal light can be amplified in a lump. Suitable values for the first wavelength λ1 and the second wavelength λ2 may be set as appropriate according to the wavelength range of the WDM signal light.

In the second embodiment described above, the laser beams of two wavelengths, namely, the first wavelength λ1 and the second wavelength λ2, are wavelength-multiplexed by the WDM coupler 32. However, the arrangement may be such that the laser beams of three or more wavelengths are wavelength-multiplexed.

Figure 8:
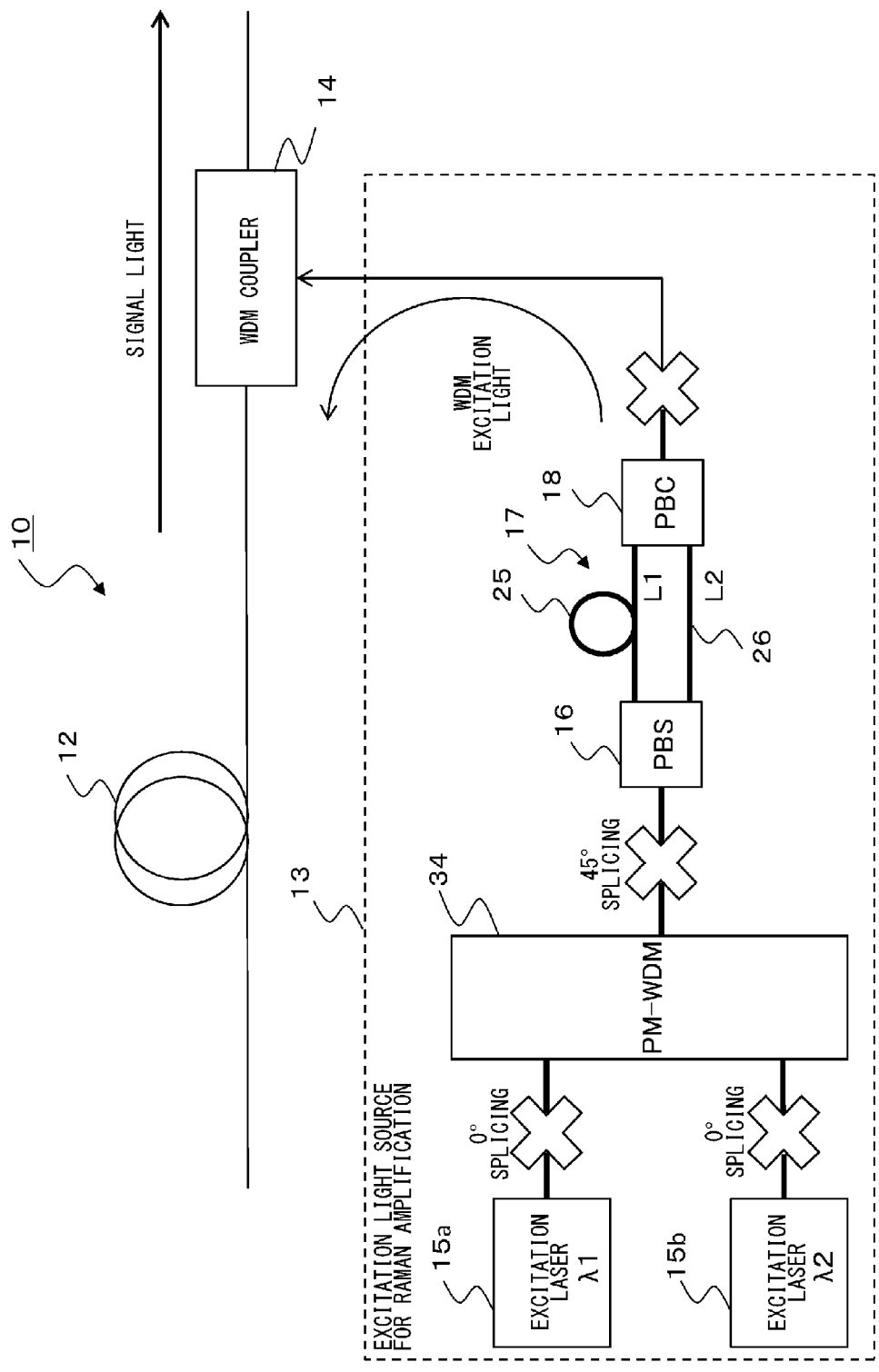
FIG. 8 shows a Raman amplifier according to a third exemplary embodiment of the present invention.

FIG. 8 shows a Raman amplifier 10 according to a third exemplary embodiment of the invention. In the Raman amplifier 10 shown in FIG. 8, too, WDM excitation light is supplied from the excitation light source for Raman amplification 13 to the optical transmission path 12.

In the excitation light source for Raman amplification 13 in the Raman amplifier 10 shown in FIG. 8, the configuration of a depolarier provided subsequent to the polarization beam splitter 16 is similar to that of the first exemplary embodiment described in connection with FIG. 6. Thus, a description is mainly given herein of a configuration of components disposed preceding the polarization beam splitter 16. Note that the components preceding the polarization beam splitter 16 are called a "laser output unit".

The laser output unit of the excitation light source for Raman amplification 13 according to the third exemplary embodiment includes a first excitation laser 15a for outputting a first laser beam of a first wavelength λ1, a second excitation laser 15b for outputting a second laser beam of a second wavelength λ2, and a polarization maintaining WDM coupler 34 that wavelength-multiplexes the first laser beam and the second laser beam. In the third exemplary embodiment, the first wavelength λ1 and the second wavelength λ2 are different wavelengths from each other.

A pigtail fiber of the first excitation laser 15a is constituted by a polarization maintaining fiber. The polarization maintaining fiber is splice-connected so that the main axis thereof coincides with that of the polarization maintaining fiber attached to an input end of the polarization maintaining WDM coupler 34 (this will hereinafter be referred to as "0-degree splicing"). Similarly, a pigtail fiber of the second excitation laser 15b is constituted by a polarization maintaining fiber, and the pigtail fiber is connected in a 0-degree splicing to a polarization maintaining fiber attached to another input end of the polarization maintaining WDM coupler 34.

The polarization maintaining fiber attached to an output end of the polarization maintaining WDM coupler 34 is connected in a 45-degree splicing to the polarization maintaining fiber attached to the input end of the polarization beam splitter 16.

In the laser output unit configured as described above, the first laser beam outputted from the first excitation laser 15a and the second laser beam outputted from the second excitation laser 15b are wavelength-multiplexed by the polarization maintaining WDM coupler 34 while their polarization states are kept.

A depolarizer configured by the polarization beam splitter 16, the time difference generator 17 and the polarization beam combiner 18 lowers the polarization degree of WDM laser beam fed from the polarization maintaining WDM coupler 34 and then outputs the WDM laser beam to the optical transmission path 12 as WDM excitation light.

By employing the excitation light source for Raman amplification 13 according to the third exemplary embodiment, the first laser beam and the second laser beam can be depolarized in a lump after they are wavelength-multiplexed. Thus, it is not required to provide as many depolarizers as the number of wavelengths as with the second exemplary embodiment described in connection with FIG. 7. Hence, the excitation light source for Raman amplification 13 according to the third exemplary embodiment is advantageous in view of cost and size.

In the third exemplary embodiment, the first excitation laser 15a and the second excitation laser 15b may each be splice-connected to the polarization maintaining WDM coupler 34 at an inclination of 90 degrees between the main axis of the polarization maintaining fiber attached to the excitation laser and the main axis of the polarization maintaining fiber attached to the polarization maintaining WDM coupler 34 (such splicing will hereinafter be referred to as "90-degree splicing"). Also, either the first excitation laser 15a or the second excitation laser 15b may be connected in a 0-degree splicing to the polarization maintaining WDM coupler 34 and the other of either the first excitation laser 15a or the second excitation laser 15b may be connected in a 90-degree splicing to the polarization maintaining WDM coupler 34.

The structure in the above-described third exemplary embodiment is such that the laser beams of two wavelengths, namely the laser beams having the first wavelength λ1 and the second wavelength λ2 are wavelength-multiplexed by the polarization maintaining WDM coupler 34. However, this should not be considered as limiting and the structure may be such that the laser beams of three or more wavelengths may be wavelength-multiplexed thereby.

Figure 9:
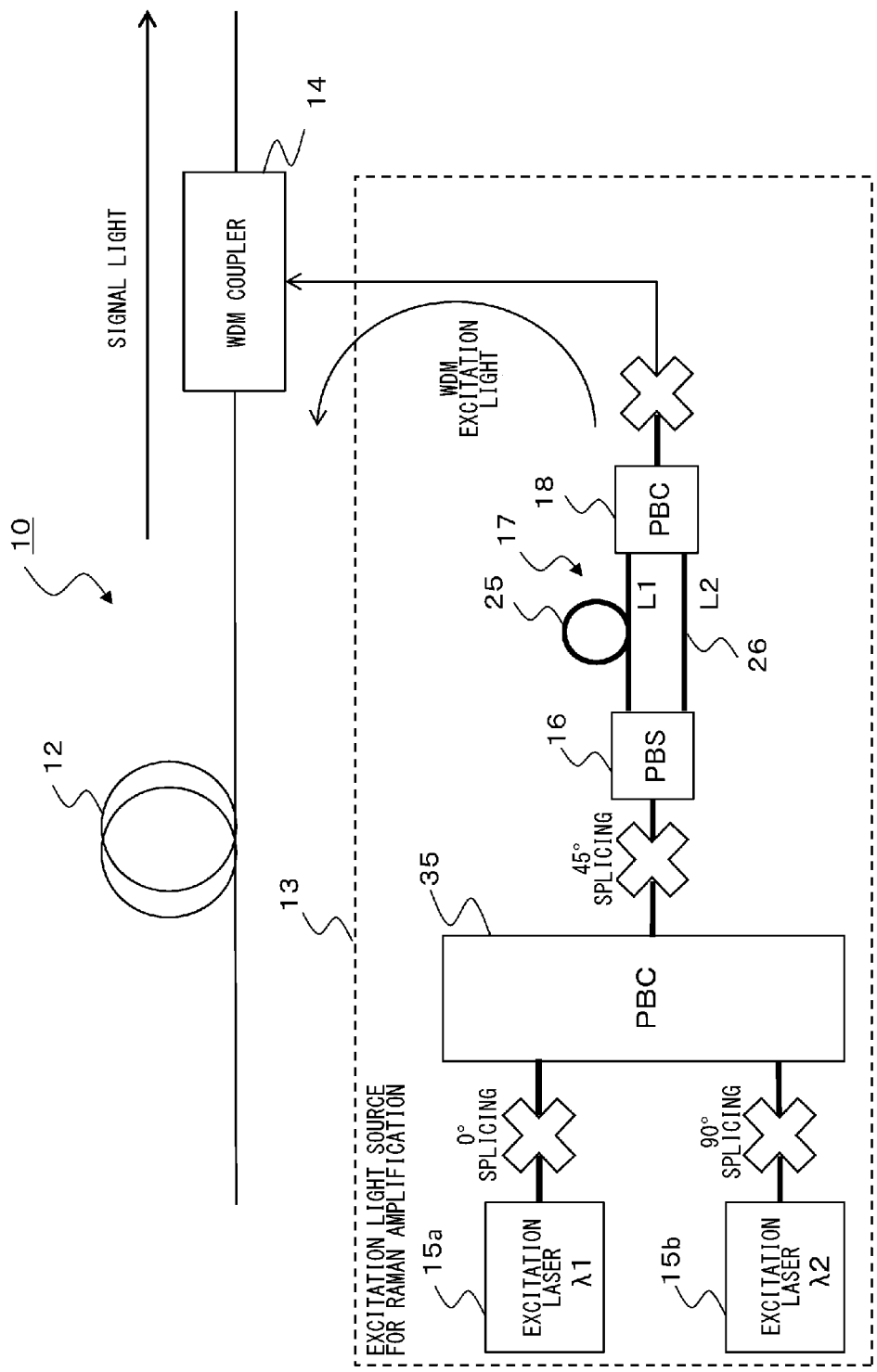
FIG. 9 shows a Raman amplifier according to a fourth exemplary embodiment of the present invention.

FIG. 9 shows a Raman amplifier according to a fourth exemplary embodiment of the invention. In the Raman amplifier 10 as shown in FIG. 9, the polarization-combined excitation light is supplied from the excitation light source for Raman amplification 13 to the optical transmission path 12.

In the Raman amplifier 10 of the excitation light source for Raman amplification 13 shown in FIG. 9, too, the configuration of a depolarier provided subsequent to the polarization beam splitter 16 is similar to that of the first exemplary embodiment described in connection with FIG. 6. Thus, a description is mainly given herein of a configuration of components of the laser output unit disposed preceding the polarization beam splitter 16.

The laser output unit of the excitation light source for Raman amplification 13 according to the fourth exemplary embodiment includes a first excitation laser 15a for outputting a first laser beam of a first wavelength λ1, a second excitation laser 15b for outputting a second laser beam of a second wavelength λ2, and a polarization beam combiner 35 that combines the first laser beam and the second laser beam. In the fourth exemplary embodiment, the first wavelength λ1 and the second wavelength λ2 may be identical to each other or may be different from each other.

A pigtail fiber of the first excitation laser 15a is constituted by a polarization maintaining fiber. The polarization maintaining fiber is connected in a 0-degree splicing to the polarization maintaining fiber attached to an input end of the polarization beam combiner 35. A pigtail fiber of the second excitation laser 15b is constituted by a polarization maintaining fiber, and the pigtail fiber is connected in a 90-degree splicing to a polarization maintaining fiber attached to another input end of the polarization beam combiner 35. In this manner, the method of splice-connecting the first excitation laser 15a to the polarization beam combiner 35 differs from the method of splice-connecting the second excitation laser 15b thereto.

The polarization maintaining fiber attached to an output end of the polarization beam combiner 35 is connected in a 45-degree splicing to the polarization maintaining fiber attached to the input end of the polarization beam splitter 16.

In the laser output unit configured as described above, the first laser beam outputted from the first excitation laser 15a and the second laser beam outputted from the second excitation laser 15b enter the polarization beam combiner 35. As described above, the first excitation laser 15a is connected in a 0-degree splicing to the polarization beam combiner 35, whereas the second excitation laser 15b is connected in a 90-degree splicing to the polarization beam combiner 35. As a result, the first laser beam and the second laser beam enter the polarization beam combiner 35 with their polarization planes being orthogonal to each other. The polarization beam combiner 35 combines the first laser beam and the second laser beam such that their polarization planes are orthogonal to each other, and then outputs the thus combined laser beam to the polarization beam splitter 16.

A depolarizer configured by the polarization beam splitter 16, the time difference generator 17 and the polarization beam combiner 18 lowers the polarization degree of the combined laser beam fed from the polarization beam combiner 35 and then outputs the combined laser beam to the optical transmission path 12 as excitation light.

By employing the excitation light source for Raman amplification 13 according to the fourth exemplary embodiment, the first laser beam and the second laser beam can be depolarized together after they are combined. Thus, it is not required to provide as many depolarizers as the number of wavelengths. Hence, the excitation light source for Raman amplification 13 according to the fourth exemplary embodiment is advantageous in view of cost and size.

In the third exemplary embodiment described in connection with FIG. 8, the first laser beam and the second laser beam are wavelength-multiplexed by use of the polarization maintaining WDM coupler 34. In order to appropriately wavelength-multiplex them, the first wavelength λ1 and the second wavelength λ2 need to be kept away from each other to some extent. However, this fourth exemplary embodiment employs the method of combining the first wavelength and the second wavelength, so that the first wavelength and the second wavelength may be identical to each other or may be close to each other. In other words, the degree of freedom in selecting the wavelength of excitation laser can be enhanced.

Figure 10:
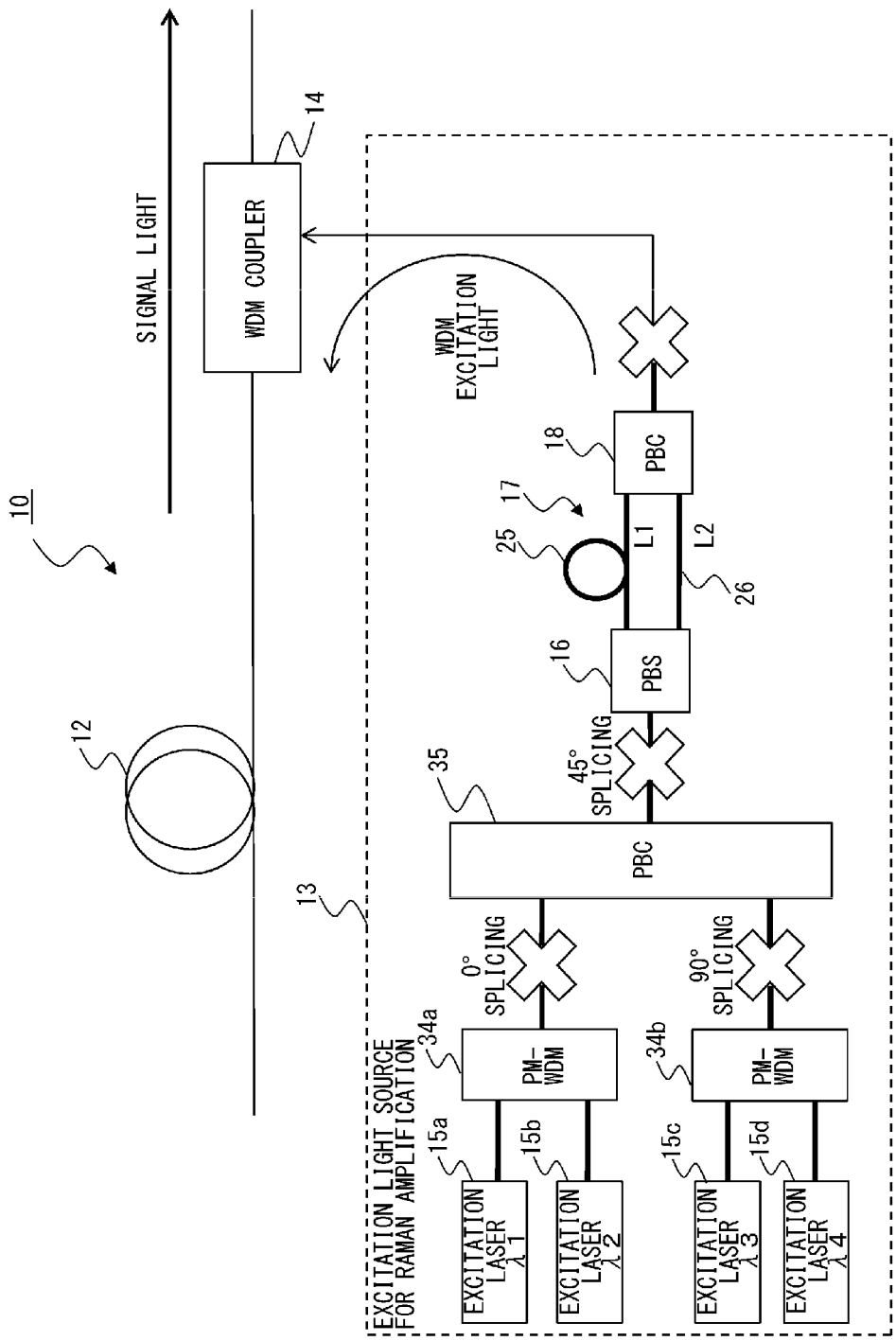
FIG. 10 shows a Raman amplifier according to a fifth exemplary embodiment of the present invention.

FIG. 10 shows a Raman amplifier according to a fifth exemplary embodiment of the invention. In the Raman amplifier 10 as shown in FIG. 10, the excitation light, which has been both wavelength-multiplexed and combined, is supplied from the excitation light source for Raman amplification 13 to the optical transmission path 12.

In the Raman amplifier 10 of the excitation light source for Raman amplification 13 shown in FIG. 10, too, the configuration of a depolarier provided subsequent to the polarization beam splitter 16 is similar to that of the first exemplary embodiment described in connection with FIG. 6. Thus, a description is mainly given herein of a configuration of components of the laser output unit disposed preceding the polarization beam splitter 16.

The laser output unit according to the fifth exemplary embodiment is configured such that the laser output unit according to the third exemplary embodiment described in connection with FIG. 8 and that according to the fourth embodiment described in connection with FIG. 9 are combined.

The laser output unit according to the fifth exemplary embodiment includes a first excitation laser 15a, a second excitation laser 15b, a third excitation laser 15c, a fourth excitation laser 15d, a first polarization maintaining WDM coupler 34a, a second polarization maintaining WDM coupler 34b, and a polarization beam combiner 35. In the fifth exemplary embodiment, first to fourth wavelengths λ1 to λ4 outputted from the first to fourth excitation lasers 15a to 15d are different from one another.

In the laser output unit, each optical device is connected via the polarization maintaining fiber. The first excitation laser 15a and the second excitation laser 15b are each connected in a 0-degree splicing to the first polarization maintaining WDM coupler 34a. Also, the third excitation laser 15c and the fourth excitation laser 15d are each connected in a 0-degree splicing to the second polarization maintaining WDM coupler 34b. The first polarization maintaining WDM coupler 34a is connected in a 0-degree splicing to the polarization beam combiner 35, whereas the second polarization maintaining WDM coupler 34b is connected in a 90-degree splicing to the polarization beam combiner 35. The polarization beam combiner 35 is connected in a 45-degree splicing to the polarization beam splitter 16.

In the laser output unit configured as described above, the first laser beam outputted from the first excitation laser 15a and the second laser beam outputted from the second excitation laser 15b are wavelength-multiplexed by the first polarization maintaining WDM coupler 34a while their polarization states are kept. Also, the third laser beam outputted from the third excitation laser 15c and the fourth laser beam outputted from the fourth excitation laser 15d are wavelength-multiplexed by the second polarization maintaining WDM coupler 34b while their polarization states are kept. Then a first WDM laser beam outputted from the first polarization maintaining WDM coupler 34a and a second WDM laser beam outputted from the second polarization maintaining WDM coupler 34b enter the polarization beam combiner 35 with their polarization planes being orthogonal to each other. The polarization beam combiner 35 combines the first WDM laser beam and the second WDM laser beam such that their polarization planes are orthogonal to each other, and then outputs the thus combined WDM laser beam to the polarization beam splitter 16.

A depolarizer configured by the polarization beam splitter 16, the time difference generator 17 and the polarization beam combiner 18 lowers the polarization degree of the wavelength-multiplexed and combined laser beams fed from the polarization beam combiner 35 and then outputs the wavelength-multiplexed and combined laser beams to the optical transmission path 12 as excitation light.

According to the excitation light source for Raman amplification 13 according to the fifth exemplary embodiment as described above, the laser beam having four wavelengths can be supplied to the optical transmission path 12 as excitation light. As a result, wideband WDM signal light can be amplified in a lump. Suitable values for the first to fourth wavelengths λ1 to λ4 may be set as appropriate according to the wavelength range of the WDM signal light. Also, the first polarization maintaining WDM coupler 34a and the second polarization maintaining WDM coupler 34b may each wavelength-multiplex three or more wavelengths.

By employing the excitation light source for Raman amplification 13 according to the fifth exemplary embodiment, the first to fourth laser beams can be depolarized together after they are wavelength-multiplexed and combined. Thus, it is not required to provide as many depolarizers as the number of wavelengths. Hence, the excitation light source for Raman amplification 13 according to the fifth exemplary embodiment is advantageous in view of cost and size.

Figure 11:
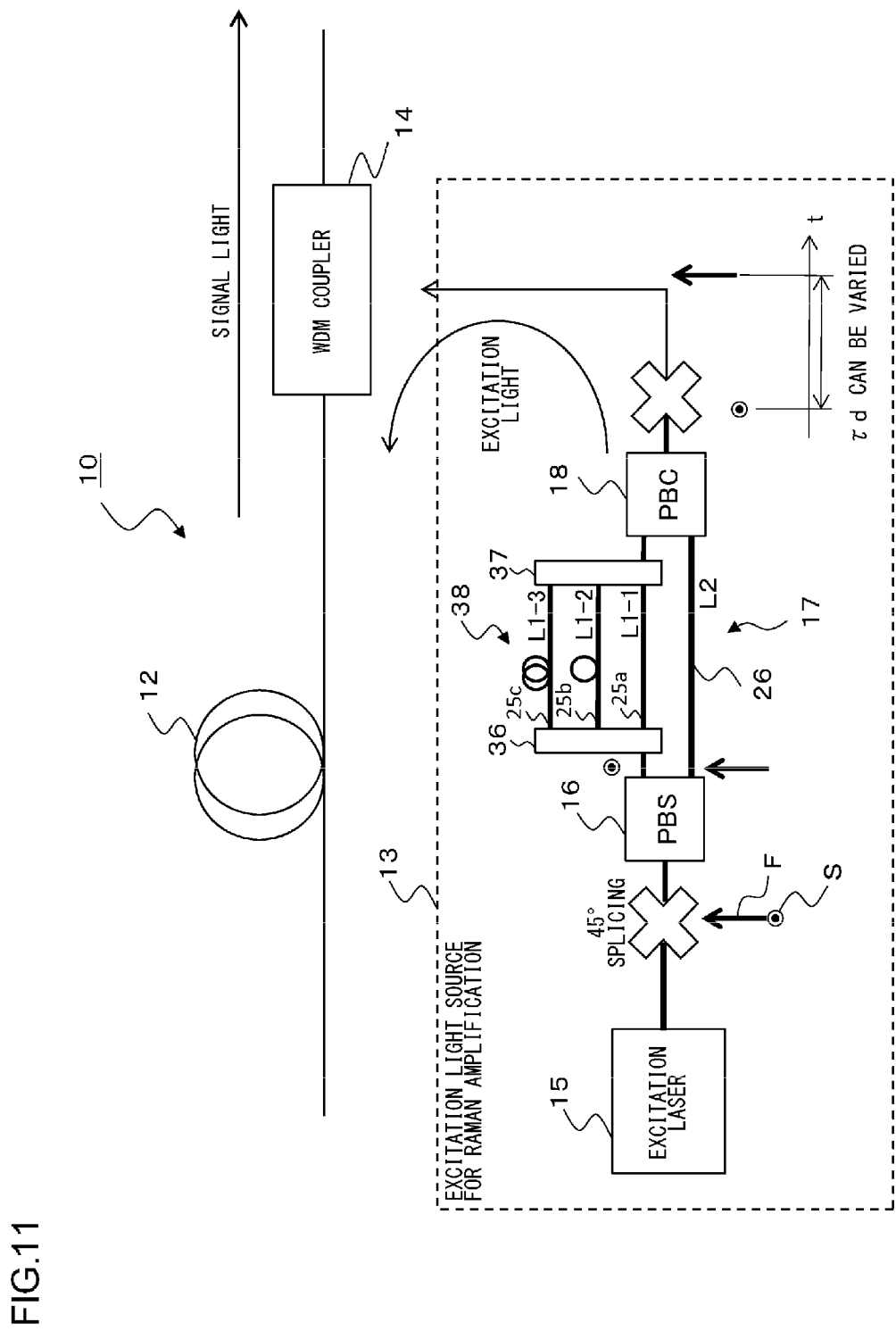
FIG. 11 shows a Raman amplifier according to a sixth exemplary embodiment of the present invention.

FIG. 11 shows a Raman amplifier according to a sixth exemplary embodiment of the invention. In the Raman amplifier 10 shown in FIG. 11, the structure of a time difference generator 17 differs from that of the first exemplary embodiment shown in FIG. 6. In the sixth exemplary embodiment, the time difference generator 17 is configured such that the difference in length between one of polarization maintaining fibers 25a to 25c through which the slow axis component S propagates and a second polarization maintaining fiber 26 through which the fast axis component F propagates is varied.

In the sixth exemplary embodiment, the fast axis component F separated by the polarization beam splitter 16 propagates through the second polarization maintaining fiber 26 and then arrives at the polarization beam combiner 18.

At the same time, the slow axis component S separated by the polarization beam splitter 16 passes through a fiber length variable unit 38 and arrives at the polarization beam combiner 18. The fiber length variable unit 38 is comprised of three polarization maintaining fibers 25a to 25c whose respective lengths differ from one another, a first optical switch 36 provided between one ends of the polarization maintaining fibers 25a to 25c and the polarization beam splitter 16, and a second optical switch 37 provided between the other ends of the polarization maintaining fibers 25a to 25c and the polarization beam combiner 18.

In the sixth embodiment, the length L1-1 of the polarization maintaining fiber 25a is the shortest, the length L1-3 of the polarization maintaining fiber 25c is the longest, and the length L1-2 of the polarization maintaining fiber 25b is set to a value intermediate between L1-1 and L1-3. The first optical switch 36 and the second optical switch 37 switch the optical path of the slow axis component S to any one of the polarization maintaining fibers 25a to 25c according to a control signal fed from an optical switch control unit (not shown). Thus, the difference in length between one of the polarization maintaining fibers 25a to 25c through which the slow axis component S passes and the second polarization maintaining fiber 26 through which the fast axis component F passes can be varied.

Suppose, for example, that the length L1-i of the polarization maintaining fiber 25a is set to 1 meter, the length L1-2 of the polarization maintaining fiber 25b is set to 3 meters, the length L1-3 of the polarization maintaining fiber 25c is set to 5 meters, and the length L2 of the second polarization maintaining fiber 26 is set to 1 meter. Then the difference in length between one of the polarization maintaining fibers 25a to 25c and the second polarization maintaining fiber 26 can be varied at three stages of 0 meter, 2 meters and 4 meters, respectively.

Note that, for simplicity of explanation, the length of a fiber between the polarization beam splitter 16 and the first optical switch 36 and that between the second optical switch 37 and the polarization beam combiner 18 are not taken into consideration here.

By employing the excitation light source for Raman amplification 13 according to the sixth exemplary embodiment, the structure thereof is such that the difference in length between the polarization maintaining fibers through which two polarization components pass can be varied. Thus, the differential group delay τd can be varied. That is, the polarization degree of excitation light can be varied.

The amount of DGD in the optical transmission path 2 varies with laying condition, temperature, vibration, and the like. Thus an optimal differential group delay τd given to an optimal excitation light is not determined in a definite manner. When the excitation light source for Raman amplification 13 is configured, as with the sixth exemplary embodiment, such that the optimal differential group delay τd given to the excitation light can be varied, an optimal differential group delay τd can be set in consideration of characteristics (e.g., DGD) of the optical transmission path 12 while the optical transmission system is actually in operation. A method for measuring the characteristics of the optical transmission path 12 may include the following, for instance. That is, DGD is measured using a measuring instrument before a commercial line starts actual operation; when an optical transmission path where failures have occurred is switched to another optical transmission path, DGD of the new optical transmission path is measured using a measuring instrument.

Figure 12:
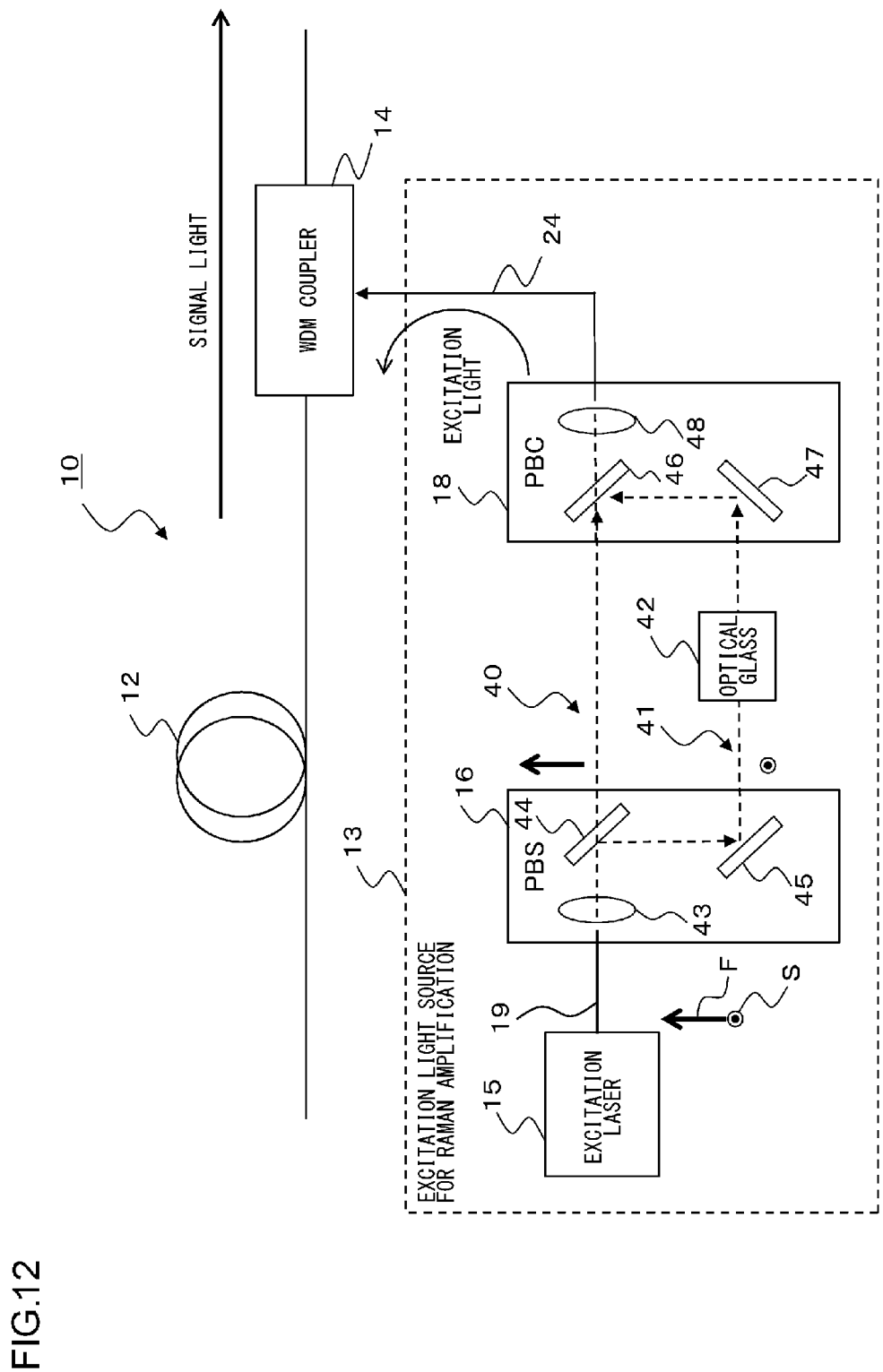
FIG. 12 shows a Raman amplifier according to a seventh exemplary embodiment of the present invention.

FIG. 12 shows a Raman amplifier 10 according to a seventh exemplary embodiment of the invention. The Raman amplifier 10 shown in FIG. 12 differs from the above-described exemplary embodiments in that the optical paths between a polarization beam splitter 16 and a polarization beam combiner 18 are constituted by a spatial optical system.

In the seventh exemplary embodiment, the polarization beam splitter 16 includes a collimator lens 43, a polarization split membrane 44, and mirror 45.

The collimator lens 43 converts the laser beam from a pigtail fiber 19 of excitation laser 15 into parallel beam. The polarization split membrane 44, which is a dielectric multiplayer formed on a predetermined side of prism, splits the laser beam from the collimator lens 43 into two polarization components. In the seventh exemplary embodiment, a fast axis component F separated by the polarization split membrane 44 passes through the polarization split membrane 44 and then arrives at the polarization beam combiner 18 via a first optical path 40. A slow axis component S separated by the polarization split membrane 44 is reflected by the polarization split membrane 44 and then arrives at the polarization beam combiner 18 via a second optical path 41.

The polarization beam combiner 18 includes a polarization combining membrane 46, a mirror 47, and a collimator lens 48.

The fast axis component F, which has passed through the first optical path 40, directly enters the polarization combining membrane 46. At the same time, the slow axis component S, which has passed through the second optical path 41, is reflected by the mirror 47 and then enters the polarization combining membrane 46. The polarization combining membrane 46 combines the fast axis component F and the slow axis component S. The laser beam that has been combined by the polarization combining membrane 46 is converted into parallel beam and then enters the single mode fiber 24. The laser beam that has entered the single mode fiber 24 is supplied to the optical transmission path 12 as excitation light.

In the seventh exemplary embodiment, an optical glass 42 is provided in the second optical path 41 through which the slow axis component S passes. The optical glass 42 used herein may be fused silica, for instance. Since the refractive index of fused silica is 1.4858 (308 nm) and is larger than that of air, the distance that the light beam travels is longer than in the case where the second optical path 41 through which the slow axis component S passes is not provided at all. As a result, the length of the first optical path 40 and the length of the second optical path 41 are set to differ from each other, so that the difference in propagation time between the fast axis component F and the slow axis component S can be created by the difference set between the lengths thereof. Optical crystal may be provided, instead, in the second optical path 41. The optical crystal used then may be LiNbO₃ or YAG (yttrium aluminum garnet) crystal, for instance.

In such a case as the seventh exemplary embodiment where the optical paths between the polarization beam splitter 16 and the polarization beam combiner 18 are a spatial optical system, the optical glass or optical crystal is provided in at least one of the optical paths. Thereby, the difference in propagation time between the two polarization components can be generated and therefore the polarization degree of excitation light can be lowered.

The excitation light source for Raman amplification 13 according to the seventh exemplary embodiment may be provided with a refractive-index control unit for varying the refractive index of optical glass or optical crystal. For example, a temperature control unit that varies the temperature of the aforementioned optical glass or the aforementioned optical crystal may serve as the refractive-index control unit. Varying the temperature of the optical glass or optical crystal results in the change of the refractive index thereof. Hence, the degree of polarization of the excitation light can be adjusted according to the differential group difference of the optical transmission path 12.

In the excitation light source for Raman amplification 13 according to the seventh exemplary embodiment, too, the laser output unit disposed preceding the polarization beam splitter 16 may be configured similarly to that of each of exemplary embodiments shown in FIG. 8 to FIG. 10.

Figure 13:
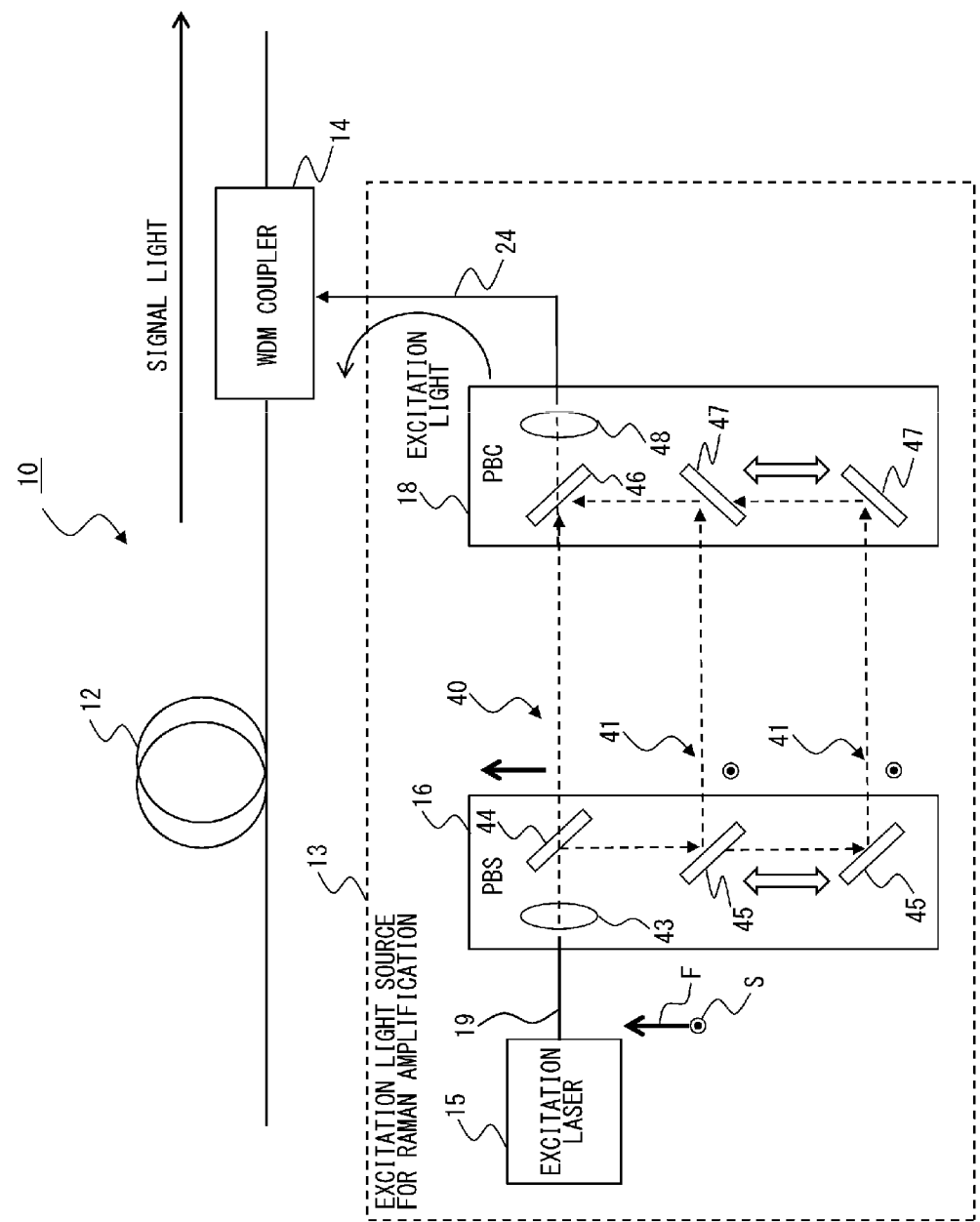
FIG. 13 shows a Raman amplifier according to an eighth exemplary embodiment of the present invention.

FIG. 13 shows a Raman amplifier 10 according to an eighth exemplary embodiment of the invention. Similar to the seventh exemplary embodiment shown in FIG. 12, the Raman amplifier 10 shown in FIG. 13 is also configured such that the optical paths between the polarization beam splitter 16 and the polarization beam combiner 18 are constituted by a spatial optical system.

The excitation light source for Raman amplification 13 according to the eighth exemplary embodiment includes a not-shown varying mechanism for varying the optical path length of the second optical path 41 through which the slow axis component S passes. As illustrated in FIG. 13, the varying mechanism is such that the optical path length of the second optical path 41 is varied by moving the positions of the mirrors 45 and the 47 provided in the second optical path 41 for the slow axis component S.

The difference in propagation time between the two polarization components can be varied by mechanically varying at least one of the optical lengths of the two polarization components. As a result, the degree of polarization of the excitation light can be adjusted according to the differential group difference of the optical transmission path 12.

In the excitation light source for Raman amplification 13 according to the eighth exemplary embodiment, too, the laser output unit disposed preceding the polarization beam splitter 16 may be configured similarly to that of each of exemplary embodiments shown in FIG. 8 to FIG. 10.

The present invention has been described based upon illustrative exemplary embodiments. The above-described exemplary embodiments are intended to be illustrative only and it will be obvious to those skilled in the art that various modifications to the combination of constituting elements and processes could be developed and that such modifications are also within the scope of the present invention.

What is claimed is:

1. An excitation light source for Raman amplification comprising:
    a laser beam output unit configured to output laser beam;
    a polarization beam splitter configured to split the laser beam into two polarization components;
    a polarization beam combiner configured to combine the two polarization components; and
    a time difference generator, provided between the polarization beam splitter and the polarization beam combiner, configured to generate a difference in propagation time between the two polarization components, wherein
        an optical path is configured to be formed between the polarization beam splitter and the polarization beam combiner is formed by a spatial optical system,
        the time difference generator is configured to generate the difference in propagation time between the two polarization components by making optical lengths of the two polarization components to differ from each other,
        the time difference generator further includes an optical glass or an optical crystal provided in an optical path of at least one of the two polarization components, and a refractive-index control unit for varying the refractive index of the optical glass or the optical crystal.

2. The excitation light source for Raman amplification according to claim 1, wherein the refractive-index control unit includes a temperature control unit for varying the temperature of the optical glass or the optical crystal.

3. The excitation light source for Raman amplification according to claim 1, wherein the polarization beam splitter and/or the polarization beam combiner include/includes a polarization split membrane that splits the laser beam from the laser beam output unit into the two polarization components.

4. An excitation light source for Raman amplification, comprising:
    a laser beam output unit configured to output laser beam;
    a polarization beam splitter configured to split the laser beam into two polarization components;
    a polarization beam combiner configured to combine the two polarization components; and
    a time difference generator, provided between the polarization beam splitter and the polarization beam combiner, configured to generate a difference in propagation time between the two polarization components,
    the laser beam output unit including:
        a first laser for outputting a first laser beam of a first wavelength;
        a second laser for outputting a second laser beam of a second wavelength; and
        a polarization maintaining wavelength-division-multiplexing (WDM) coupler for wavelength-multiplexing the first laser and the second laser with polarization states thereof being kept.

5. An excitation light source for Raman amplification comprising:

a laser beam output unit configured to output laser beam;
a polarization beam splitter configured to split the laser beam into two polarization components;
a polarization beam combiner configured to combine the two polarization components;
a time difference generator, provided between the polarization beam splitter and the polarization beam combiner, configured to generate a difference in propagation time between the two polarization components,
the laser beam output unit including:
a first laser for outputting a first laser beam;
a second laser for outputting a second laser beam; and
a polarization beam combiner for combining the first laser beam and the second laser beam such that polarization planes of the first laser beam and the second laser beam are orthogonal to each other.

6. An excitation light source for Raman amplification comprising:
a laser beam output unit configured to output laser beam;
a polarization beam splitter configured to split the laser beam into two polarization components;
a polarization beam combiner configured to combine the two polarization components; and
a time difference generator, provided between the polarization beam splitter and the polarization beam combiner, configured to generate a difference in propagation time between the two polarization components,
the laser beam output unit including:
a first laser for outputting a first laser beam of a first wavelength;
a second laser for outputting a second laser beam of a second wavelength;
a third laser for outputting a third laser beam of a third wavelength;
a fourth laser for outputting a fourth laser beam of a fourth wavelength;
a first polarization maintaining wavelength-division-multiplexing (WDM) coupler for wavelength-multiplexing the first laser and the second laser with polarization states thereof being kept;
a second polarization maintaining WDM coupler for wavelength-multiplexing the third laser and the fourth laser with polarization states thereof being kept; and
a polarization beam combiner for combining a first wavelength-multiplexed laser beam outputted from the first polarization maintaining WDM coupler and a second wavelength-multiplexed laser beam outputted from the second polarization maintaining WDM coupler such that polarization planes of the first wavelength-multiplexed laser beam and the second wavelength-multiplexed laser beam are orthogonal to each other.

7. An excitation light source for Raman amplification comprising:
a first laser for outputting a first laser beam of a first wavelength;
a first polarization beam splitter configured to split the first laser beam into two polarization components;
a first polarization beam combiner configured to combine the two polarization components split by the first polarization beam splitter;
a first time difference generator, provided between the first polarization beam splitter and the first polarization beam combiner, configured to generate a difference in propagation time between the two polarization components;
a second laser for outputting a second laser beam of a second wavelength;
a second polarization beam splitter configured to split the second laser beam into two polarization components;
a second polarization beam combiner configured to combine the two polarization components split by the second polarization beam splitter;
a second time difference generator, provided between the second polarization beam splitter and the second polarization beam combiner, configured to generate a difference in propagation time between the two polarization components; and
a wavelength-division-multiplexing (WDM) coupler configured to wavelength-multiplex the first laser beam outputted from the first polarization beam combiner and the second laser beam outputted from the second polarization beam combiner.

8. A Raman amplifier including an excitation light source for Raman amplification according to claim 1.

9. An optical transmission system including a Raman amplifier according to claim 8.

* * * * *